(12) United States Patent
Xie

(10) Patent No.: US 12,341,029 B2
(45) Date of Patent: Jun. 24, 2025

(54) WET CLEAN APPARATUS FOR SINGLE WAFER

(71) Applicant: Shanghai Huali Integrated Circuit Corporation, Shanghai (CN)

(72) Inventor: Wenqian Xie, Shanghai (CN)

(73) Assignee: Shanghai Huali Integrated Circuit Corporation (CN)

( * ) Notice: Subject to any disclaimer, the term of this patent is extended or adjusted under 35 U.S.C. 154(b) by 266 days.

(21) Appl. No.: 18/187,135

(22) Filed: Mar. 21, 2023

(65) Prior Publication Data

US 2024/0038552 A1    Feb. 1, 2024

(30) Foreign Application Priority Data

Jul. 27, 2022  (CN) .......................... 202210895538.8

(51) Int. Cl.
*H01L 21/67* (2006.01)
(52) U.S. Cl.
CPC .... *H01L 21/67063* (2013.01); *H01L 21/6704* (2013.01)
(58) Field of Classification Search
CPC ....................... H01L 21/67063; H01L 21/6704
USPC ........................................................ 134/182
See application file for complete search history.

(56) References Cited

U.S. PATENT DOCUMENTS

2018/0221925 A1*  8/2018  Ito ..................... H01L 21/67051

* cited by examiner

*Primary Examiner* — Tinsae B Ayalew
(74) *Attorney, Agent, or Firm* — Quarles & Brady LLP

(57) ABSTRACT

The present application discloses a wet clean apparatus for a single wafer, comprising: a baffle arranged on the periphery of the wafer bearing platform. The anti-splash structure comprises: a first vertical plate, wherein a length direction thereof is perpendicular to the surface of the wafer; a first opening transversely passing through the first vertical plate, wherein the first opening is arranged on a movement track of the etchant shaken off from the surface of the wafer; and a second transverse plate, wherein a first end thereof is fixedly arranged on the outer side surface of the first vertical plate, the top surface of the second transverse plate is horizontal and is lower than or flush with the bottom surface of the first opening, and the etchant passing through the first opening flows on the top surface of the second transverse plate and is decelerated.

11 Claims, 2 Drawing Sheets

WET CLEAN APPARATUS FOR SINGLE WAFER

CROSS-REFERENCES TO RELATED APPLICATIONS

This application claims the priority to Chinese patent application No. CN 202210895538.8, filed on Jul. 27, 2022, and entitled "WET CLEAN APPARATUS FOR SINGLE WAFER", the disclosure of which is incorporated herein by reference in entirety.

TECHNICAL FIELD

The present application relates to a device for manufacturing a semiconductor integrated circuit, in particular to a wet clean apparatus for a single wafer.

BACKGROUND

FIG. 1 is a schematic diagram of a structure of an existing wet clean apparatus for a single wafer. The existing wet clean apparatus for a single wafer includes:
 a wafer bearing platform 101 having a rotation function, used for placement of a wafer 103 and rotation of the wafer 103.

A plurality of clamps 102 are arranged on the wafer bearing platform 101, and the clamps 102 realizes fixation of the wafer 103 by clamping the edge of the wafer 103.

The wafer bearing platform 101 is connected to a motor via a bearing, and the motor drives the wafer bearing platform 101 to rotate.

Generally, heating and cooling apparatuses are arranged on the wafer bearing platform 101, so as to control an etching temperature.

An etchant injection apparatus is used for injecting an etchant onto the surface of the wafer 103.

In the prior art, the etchant injection apparatus includes a nozzle and an arm 104. FIG. 1 shows two nozzles, which are represented by marks 105a and 105b respectively and used for injecting different etchants respectively. FIG. 1 shows two etchants, which are represented by marks 106a and 106b respectively. The nozzle is arranged on the arm 104, the nozzle is connected to an etchant conveying pipeline 107, and the etchant conveying pipeline 107 is connected to an etchant source.

A baffle is arranged on the periphery of the wafer bearing platform 101. Generally, different etchants require different baffles. FIG. 1 shows baffles corresponding to the two different etchants, which are represented by marks 108a and 108b respectively.

The function of the peripheral baffle includes: preventing spattering of a chemical solution, i.e., the etchant; and blocking and recycling the etchant to realize, for example, acid discharge, base discharge, and organic liquid discharge.

However, the baffle shown in FIG. 1 cannot avoid a splash. It can be seen from FIG. 1 that the baffles 108a and 108b have the same structure that is composed of a vertical plate. An extension section extending to the inner side, i.e., one side of the wafer 103, is arranged at the top end of the vertical plate. The arrow dashed line in FIG. 1 represents a movement track of the etchant shaken off from the wafer 103. It can be seen that the etchant with a relatively high speed may collide with the baffle. As an incident speed of the etchant is relatively high, a speed of reflection after collision may also be very high, and finally a splash as represented by the arrow dashed line 109 may be produced. The etchant corresponding to the arrow dashed line 109 finally may return to the surface of the wafer 103, thus etching the surface of the wafer 103 and forming a defect, which eventually affects the product yield.

An existing improved structure for reducing a solution splash includes: increasing a spacing between the baffle and the wafer, or using a fan filter unit (FFU) to reduce a splash.

BRIEF SUMMARY

According to some embodiments in this application a wet clean apparatus for a single wafer provided by the present application includes: a wafer bearing platform having a rotation function, used for placement of a wafer and rotation of the wafer;
 an etchant injection apparatus used for injecting an etchant onto the surface of the wafer; and
 a baffle arranged on the periphery of the wafer bearing platform.

The baffle includes an anti-splash structure used for decelerating the etchant shaken off from the wafer.

The anti-splash structure includes:
 a first vertical plate, wherein the length direction of the first vertical plate is perpendicular to the surface of the wafer, and there is a spacing between the inner side surface of the first vertical plate and the wafer;
 a first opening transversely passing through the first vertical plate, wherein the first opening is arranged on a movement track of the etchant shaken off from the surface of the wafer so that the etchant passes through the first opening; and
 a second transverse plate, wherein a first end of the second transverse plate is fixedly arranged on the outer side surface of the first vertical plate; the top surface of the second transverse plate is horizontal and the top surface of the second transverse plate is lower than or flush with the bottom surface of the first opening, and the etchant passing through the first opening flows on the top surface of the second transverse plate so that the etchant undergoes a first time of deceleration.

In some cases, the anti-splash structure further includes:
 a third inclined plate, wherein a first end of the third inclined plate is fixedly arranged on a second end of the second transverse plate; the top surface of the third inclined plate presents a slope structure, a lowest end of the top surface of the third inclined plate is flush with the top surface of the second transverse plate, and the etchant flows from the top surface of the second transverse plate to the lowest end of the top surface of the third inclined plate and then gradually rises along the slope structure to realize a second time of deceleration.

In some cases, the anti-splash structure further includes:
 a fourth arc plate, wherein a first end of the fourth arc plate is fixedly arranged on a second end of the third inclined plate, the top surface of the fourth arc plate presents an arc structure, a lowest end of the top surface of the fourth arc plate is flush with a topmost end of the top surface of the third inclined plate, and the etchant flows from the top surface of the third inclined plate to the lowest end of the top surface of the fourth arc plate and then moves along the arc slope structure to realize a third time of deceleration.

In some cases, a track of the arc structure is a semi-circle or semi-ellipse.

In some cases, in a transverse direction, a second end of the arc structure is located between the first end and the second end of the third inclined plate, so that the etchant undergoing the deceleration realized by the arc structure flows back to the third inclined plate.

In some cases, the baffle further includes a recovery structure for collecting the etchant, the recovery structure including:
  a second opening vertically passing through the second transverse plate, wherein the decelerated etchant passes through the second opening and flows downward to realize recovery.

In some cases, the recovery structure further includes:
  a fifth vertical plate, wherein a top end of the fifth vertical plate is fixedly arranged on the bottom surface of the second transverse plate between the second opening and the second end of the second transverse plate.

In some cases, the height of the first vertical plate above the first opening is greater than or equal to a maximum height of a splash formed by the etchant flowing back from the arc structure to the third inclined plate, so as to prevent the flowing-back etchant from splashing onto the edge of the wafer.

In some cases, the etchant injection apparatus includes a nozzle and an arm, the nozzle is arranged on the arm, the nozzle is connected to an etchant conveying pipeline, and the etchant conveying pipeline is connected to an etchant source.

In some cases, the etchant includes an acid, a base, or an organic liquid.

In some cases, each of the etchants is provided with a baffle.

In some cases, there are a plurality of baffles.

Each of the baffles realizes recovery of more than one of the etchants.

In some cases, the first vertical plate of part of the baffles is provided with more than two first openings, and the first openings are positioned at different heights in the length direction of the first vertical plate.

A corresponding set of the anti-splash structure and the recovery structure is arranged at each of the first openings.

The first vertical plate can move vertically, when the first opening moves to a position on the movement track of the etchant shaken off from the surface of the wafer, the anti-splash structure and the recovery structure corresponding to the first opening are used for the recovery of the etchant, and the anti-splash structure and the recovery structure corresponding to each of the first openings realize the recovery of one of the etchants.

The present application provides a particular configuration of the baffle. The baffle can control a flow path of the shaken-off etchant, and deceleration of the etchant is realized on the flow path, so as to prevent the shaken-off etchant from splashing onto the wafer and prevent a splash of the etchant from forming a defect on the wafer, thus improving the product yield.

In the present application, by controlling the flow path of the shaken-off etchant, the decelerated etchant can flow back to a recovery site to realize the recovery of the etchant.

The present application can be realized by improving the baffle on the basis of the flowing characteristics of the etchant. Therefore, the present application also has the characteristics of simple structure, low cost, and easy implementation.

BRIEF DESCRIPTION OF THE DRAWINGS

The present application is further described in detail below with reference to the drawings and specific embodiments.

DETAILED DESCRIPTION OF THE DISCLOSURE

Figure 1:
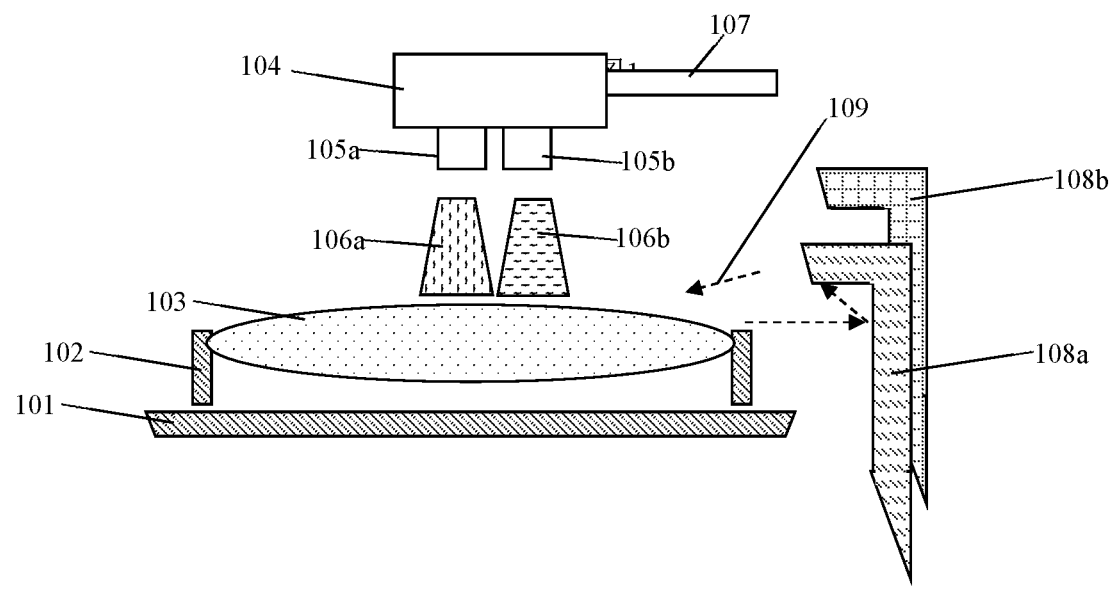
FIG. 1 is a schematic diagram of a structure of an existing wet clean apparatus for a single wafer.
Figure 2:
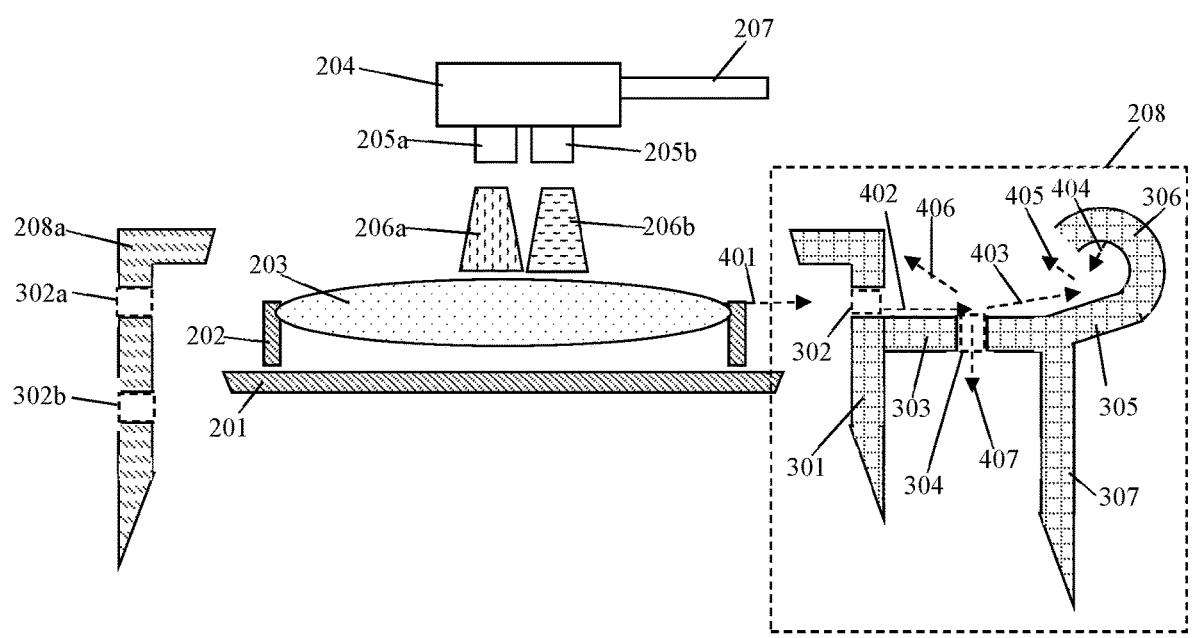
FIG. 2 is a schematic diagram of a structure of a wet clean apparatus for a single wafer according to an embodiment of the present application.

FIG. 2 is a schematic diagram of a structure of a wet clean apparatus for a single wafer according to an embodiment of the present application. The wet clean apparatus for a single wafer according to this embodiment of the present application includes:
  a wafer bearing platform 201 having a rotation function, used for placement of a wafer 203 and rotation of the wafer 203.

In this embodiment of the present application, a plurality of clamps 202 are arranged on the wafer bearing platform 201, and the clamps 202 realizes fixation of the wafer 203 by clamping the edge of the wafer 203.

The wafer bearing platform 201 is connected to a motor via a bearing, and the motor drives the wafer bearing platform 201 to rotate.

Generally, heating and cooling apparatuses are arranged on the wafer bearing platform 201, so as to control an etching temperature.

An etchant injection apparatus is used for injecting an etchant onto the surface of the wafer 203.

In this embodiment of the present application, the etchant injection apparatus includes a nozzle and an arm 204. FIG. 2 shows two nozzles, which are represented by marks 205a and 205b respectively and used for injecting different etchants respectively. FIG. 2 shows two etchants, which are represented by marks 206a and 206b respectively. The nozzle is arranged on the arm 204, the nozzle is connected to an etchant conveying pipeline 207, and the etchant conveying pipeline 207 is connected to an etchant source.

A baffle 208 is arranged on the periphery of the wafer bearing platform 201.

The baffle 208 includes an anti-splash structure used for decelerating the etchant shaken off from the wafer 203.

The anti-splash structure includes:
  a first vertical plate 301, wherein the length direction of the first vertical plate 301 is perpendicular to the surface of the wafer 203, and there is a spacing between the inner side surface of the first vertical plate 301 and the wafer 203;
  a first opening 302 transversely passing through the first vertical plate 301, wherein the first opening 302 is arranged on a movement track of the etchant shaken off from the surface of the wafer 203 so that the etchant passes through the first opening 302, the movement track of the etchant shaken off from the surface of the wafer 203 being represented by the arrow dashed line 401; and
  a second transverse plate 303, wherein a first end of the second transverse plate 303 is fixedly arranged on the outer side surface of the first vertical plate 301; the top surface of the second transverse plate 303 is horizontal and the top surface of the second transverse plate 303 is lower than or flush with the bottom surface of the first opening 302, and the etchant passing through the first opening 302 flows on the top surface of the second transverse plate 303 so that the etchant undergoes a first time of deceleration. A flow path of the etchant on the top surface of the second transverse plate 303 is represented by the arrow dashed line 402. The friction between the top surface of the second transverse plate 303 and the etchant realizes the first time of deceleration of the etchant. In some embodiments, by increasing the length of the second transverse plate 203, the speed of the etchant can be reduced such that no splash occurs by mere the first time of deceleration.

In this embodiment of the present application, the anti-splash structure further includes:

a third inclined plate 305, wherein a first end of the third inclined plate 305 is fixedly arranged on a second end of the second transverse plate 303; the top surface of the third inclined plate 305 presents a slope structure, a lowest end of the top surface of the third inclined plate 305 is flush with the top surface of the second transverse plate 303, and the etchant flows from the top surface of the second transverse plate 303 to the lowest end of the top surface of the third inclined plate 305 and then gradually rises along the slope structure to realize a second time of deceleration. The arrow dashed line 403 in FIG. 2 shows that the etchant rises from the top surface of the second transverse plate 203 to the top surface of the third inclined plate 305. It can be seen that the third inclined plate 305 not only decelerates the etchant by means of the friction, but also decelerates the etchant by means of the gravity of the etchant. Therefore, the resistance in the second time of deceleration is greater and the deceleration effect is better. In some embodiments, the speed of the etchant can be reduced such that no splash occurs by the second time of deceleration realized by the third inclined plate 305.

In this embodiment of the present application, the anti-splash structure further includes:

a fourth arc plate 306, wherein a first end of the fourth arc plate 306 is fixedly arranged on a second end of the third inclined plate 305, the top surface of the fourth arc plate 306 presents an arc structure, a lowest end of the top surface of the fourth arc plate 306 is flush with a topmost end of the top surface of the third inclined plate 305, and the etchant flows from the top surface of the third inclined plate 305 to the lowest end of the top surface of the fourth arc plate 306 and then moves along the arc slope structure to realize a third time of deceleration. It can be seen from FIG. 2 that the fourth arc plate 306 also decelerates the etchant by means of the surface friction and the gravity of the etchant. Therefore, the resistance in the third time of deceleration is also relatively large. As indicated by the arrow dashed line 404 in FIG. 2, a movement direction of the etchant is changed significantly, and finally a back flow along the arrow dashed line 404 is generated.

In this embodiment of the present application, a track of the arc structure is a semi-circle or semi-ellipse.

In a transverse direction, a second end of the arc structure is located between the first end and the second end of the third inclined plate 305, so that the etchant undergoing the deceleration realized by the arc structure flows back to the third inclined plate 305. As indicated by the arrow dashed line 405, the flowing-back etchant may generate a splash. The arrow dashed line 406 also represents a splash generated by the etchant during the movement. In this embodiment of the present application, the height of the first vertical plate 301 above the first opening 302 is greater than or equal to a maximum height of a splash formed by the etchant flowing back from the arc structure to the third inclined plate 305, so as to prevent the flowing-back etchant from splashing onto the edge of the wafer 203.

In this embodiment of the present application, the baffle 208 further includes a recovery structure for collecting the etchant, the recovery structure including:

a second opening 304 vertically passing through the second transverse plate 303, wherein the decelerated etchant passes through the second opening 304 and flows downward to realize recovery. The arrow dashed line 407 represents a recovery path of the etchant. A recovery barrel is placed below the arrow dashed line 407, and the etchant may flow downward into the recovery barrel along the arrow dashed line 407.

The recovery structure further includes:

a fifth vertical plate 307, wherein a top end of the fifth vertical plate 307 is fixedly arranged on the bottom surface of the second transverse plate 303 between the second opening 304 and the second end of the second transverse plate 303.

The etchant includes an acid, a base, or an organic liquid.

In this embodiment of the present application, there are a plurality of baffles 208.

Each of the baffles 208 realizes recovery of more than one of the etchants.

In some embodiments, the first vertical plate 301 of part of the baffles 208 is provided with more than two first openings 302, and the first openings 302 are positioned at different heights in the length direction of the first vertical plate 301. In FIG. 2, the baffle separately marked with the mark 208*a* is provided with two first openings and the two first openings are marked with marks 302*a* and 302*b* respectively.

A corresponding set of the anti-splash structure and the recovery structure is arranged at each of the first openings 302. In FIG. 2, only the first vertical plate 301 of the baffle 208*a* is shown, while the other structures are omitted. In some embodiments, the anti-splash structure and the recovery structure corresponding to each of the first openings of the baffle 208*a* can be the same as the anti-splash structure and the recovery structure of the baffle 208 in FIG. 2. For example, the second transverse plate 303, the third inclined plate 305, the fourth arc plate 306, the second opening 304, and the fifth vertical plate 307 that are the same as those in the baffle 208 in FIG. 2 can be arranged at the first opening 302*a*; the second transverse plate 303, the third inclined plate 305, the fourth arc plate 306, the second opening 304, and the fifth vertical plate 307 which are the same as those in the baffle 208 in FIG. 2 can be arranged at the first opening 302*b*. In other embodiments, the anti-splash structure and the recovery structure corresponding to each of the first openings of the baffle 208*a* may be different from the anti-splash structure and the recovery structure of the baffle 208 in FIG. 2.

The first vertical plate 301 of the baffle 208*a* can move vertically. When the first opening 302 moves to a position on the movement track of the etchant shaken off from the surface of the wafer, the anti-splash structure and the recovery structure corresponding to the first opening 302 are used for the recovery of the etchant. The anti-splash structure and the recovery structure corresponding to each of the first openings 302 realize the recovery of one of the etchants. For example, when the recovery of an acid is required, it is necessary to move the first opening 302*a* to a position on the movement track of the etchant shaken off from the surface of the wafer; when the recovery of a base is required, it is necessary to move the first opening 302*b* to a position on the movement track of the etchant shaken off from the surface of the wafer.

This embodiment of the present application provides a particular configuration of the baffle 208. The baffle 208 can control a flow path of the shaken-off etchant, and deceleration of the etchant is realized on the flow path, so as to prevent the shaken-off etchant from splashing onto the wafer 203. For example, the etchant cannot splash onto even the outermost edge area of the wafer 203 having a width of 2-3 cm. Therefore, this embodiment of the present application can prevent a splash of the etchant from forming a defect on the wafer 203, thus improving the product yield.

In this embodiment of the present application, by controlling the flow path of the shaken-off etchant, the decelerated etchant can flow back to a recovery site to realize the recovery of the etchant.

This embodiment of the present application can be realized by improving the baffle 208 on the basis of the flowing characteristics of the etchant. Therefore, this embodiment of the present application also has the characteristics of simple structure, low cost, and easy implementation.

The present application is described in detail above via specific embodiments, which, however, do not intended to limit the present application. Without departing from the principle of the present application, those skilled in the art could also make many changes and improvements, which should also be construed as the protection scope of the present application.

What is claimed is:

1. A wet clean apparatus for a single wafer, comprising:
   a wafer bearing platform having a rotation function, used for placement of a wafer and rotation of the wafer;
   an etchant injection apparatus used for injecting an etchant onto the surface of the wafer; and
   a baffle arranged on the periphery of the wafer bearing platform;
   the baffle comprising an anti-splash structure used for decelerating the etchant shaken off from the wafer;
   the anti-splash structure comprising:
   a first vertical plate, wherein the length direction of the first vertical plate is perpendicular to the surface of the wafer, and there is a spacing between the inner side surface of the first vertical plate and the wafer;
   a first opening transversely passing through the first vertical plate, wherein the first opening is arranged on a movement track of the etchant shaken off from the surface of the wafer so that the etchant passes through the first opening; and
   a second transverse plate, wherein a first end of the second transverse plate is fixedly arranged on the outer side surface of the first vertical plate; the top surface of the second transverse plate is horizontal and the top surface of the second transverse plate is lower than or flush with the bottom surface of the first opening, and the etchant passing through the first opening flows on the top surface of the second transverse plate so that the etchant undergoes a first time of deceleration.

2. The wet clean apparatus for a single wafer according to claim 1, wherein the anti-splash structure further comprises:
   a third inclined plate, wherein a first end of the third inclined plate is fixedly arranged on a second end of the second transverse plate; the top surface of the third inclined plate presents a slope structure, a lowest end of the top surface of the third inclined plate is flush with the top surface of the second transverse plate, and the etchant flows from the top surface of the second transverse plate to the lowest end of the top surface of the third inclined plate and then gradually rises along the slope structure to realize a second time of deceleration.

3. The wet clean apparatus for a single wafer according to claim 2, wherein the anti-splash structure further comprises:
   a fourth arc plate, wherein a first end of the fourth arc plate is fixedly arranged on a second end of the third inclined plate, the top surface of the fourth arc plate presents an arc structure, a lowest end of the top surface of the fourth arc plate is flush with a topmost end of the top surface of the third inclined plate, and the etchant flows from the top surface of the third inclined plate to the lowest end of the top surface of the fourth arc plate and then moves along the arc slope structure to realize a third time of deceleration.

4. The wet clean apparatus for a single wafer according to claim 3, wherein a track of the arc structure is a semi-circle or semi-ellipse.

5. The wet clean apparatus for a single wafer according to claim 3, wherein in a transverse direction, a second end of the arc structure is located between the first end and the second end of the third inclined plate, so that the etchant undergoing the deceleration realized by the arc structure flows back to the third inclined plate.

6. The wet clean apparatus for a single wafer according to claim 5, wherein the baffle further comprises a recovery structure for collecting the etchant, the recovery structure comprising:
   a second opening vertically passing through the second transverse plate, wherein the decelerated etchant passes through the second opening and flows downward to realize recovery.

7. The wet clean apparatus for a single wafer according to claim 6, wherein the recovery structure further comprises:
   a fifth vertical plate, wherein a top end of the fifth vertical plate is fixedly arranged on the bottom surface of the second transverse plate between the second opening and the second end of the second transverse plate.

8. The wet clean apparatus for a single wafer according to claim 7, wherein the etchant injection apparatus comprises a nozzle and an arm, the nozzle is arranged on the arm, the nozzle is connected to an etchant conveying pipeline, and the etchant conveying pipeline is connected to an etchant source.

9. The wet clean apparatus for a single wafer according to claim 8, wherein the etchant comprises an acid, a base, or an organic liquid.

10. The wet clean apparatus for a single wafer according to claim 9, wherein there are a plurality of baffles; and
    each of the baffles realizes recovery of at least one type of the etchant from the acid, the base, or the organic liquid.

11. The wet clean apparatus for a single wafer according to claim 10, wherein the first vertical plate of part of the baffles is provided with more than two first openings, and the first openings are positioned at different heights in the length direction of the first vertical plate;
    a corresponding set of the anti-splash structure and the recovery structure is arranged at each of the first openings; and
    the first vertical plate can move vertically, when the first opening moves to a position on the movement track of the etchant shaken off from the surface of the wafer, the anti-splash structure and the recovery structure corresponding to the first opening are used for the recovery of the etchant, and the anti-splash structure and the recovery structure corresponding to each of the first openings realize the recovery of one of the etchants.

* * * * *